(12) United States Patent
Namba et al.

(10) Patent No.: US 11,752,686 B2
(45) Date of Patent: Sep. 12, 2023

(54) IMPRINT APPARATUS AND METHOD OF CONTROLLING IMPRINT APPARATUS

(71) Applicant: CANON KABUSHIKI KAISHA, Tokyo (JP)

(72) Inventors: Hisashi Namba, Utsunomiya (JP); Noriyasu Hasegawa, Utsunomiya (JP); Yoshimasa Araki, Yokohama (JP); Keita Sakai, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 284 days.

(21) Appl. No.: 17/012,287

(22) Filed: Sep. 4, 2020

(65) Prior Publication Data
US 2021/0069960 A1  Mar. 11, 2021

(30) Foreign Application Priority Data

Sep. 11, 2019 (JP) .................. 2019-165638

(51) Int. Cl.
*B29C 59/00* (2006.01)
*B29C 59/02* (2006.01)
*B29C 37/00* (2006.01)
*B29L 31/34* (2006.01)

(52) U.S. Cl.
CPC .......... *B29C 59/002* (2013.01); *B29C 37/00* (2013.01); *B29C 59/026* (2013.01); *B29C 2037/90* (2013.01); *B29L 2031/34* (2013.01)

(58) Field of Classification Search
None
See application file for complete search history.

(56) References Cited

U.S. PATENT DOCUMENTS

| | | |
|---|---|---|
| 9,834,002 B2 | 12/2017 | Araki et al. |
| 10,518,546 B2 | 12/2019 | Araki et al. |
| 11,535,039 B2 | 12/2022 | Kawahara et al. |
| 2009/0183676 A1* | 7/2009 | Fujii .................. H01L 21/6715 118/300 |

(Continued)

FOREIGN PATENT DOCUMENTS

| | | |
|---|---|---|
| JP | 2016-196128 A | 11/2016 |
| JP | 2018-006747 A | 1/2018 |

(Continued)

OTHER PUBLICATIONS

Kawahara et al., U.S. Appl. No. 16/766,384, filed May 22, 2020.

(Continued)

*Primary Examiner* — Mohammad M Ameen
(74) *Attorney, Agent, or Firm* — VENABLE LLP

(57) ABSTRACT

An imprint apparatus includes: a movable housing unit; an ejection head provided in the housing unit and configured to eject an ejection material; a flexible member provided in the housing unit and separating the housing unit into a first storing space communicating with the ejection head and storing the ejection material and a second storing space storing hydraulic liquid; a first channel and a second channel communicating with the second storing space; a pressure control unit configured to control a pressure in the second storing space through the channels; and a bubble detection unit configured to detect bubbles in the channels.

13 Claims, 6 Drawing Sheets

(56) References Cited

U.S. PATENT DOCUMENTS

| | | | |
|---|---|---|---|
| 2011/0171744 A1* | 7/2011 | Saegusa | G01N 35/1009 |
| | | | 422/106 |
| 2012/0172800 A1* | 7/2012 | Dudar | A61M 5/172 |
| | | | 604/123 |
| 2014/0212558 A1* | 7/2014 | Spierts | A22C 11/08 |
| | | | 426/519 |
| 2016/0158461 A1* | 6/2016 | Haddad | A61M 5/365 |
| | | | 604/122 |
| 2018/0001652 A1* | 1/2018 | Araki | B41J 2/18 |
| 2020/0338806 A1 | 10/2020 | Kawahara et al. | |
| 2020/0341369 A1 | 10/2020 | Namba et al. | |
| 2020/0376851 A1 | 12/2020 | Kuri et al. | |

FOREIGN PATENT DOCUMENTS

| | | |
|---|---|---|
| JP | 2019-098588 A | 6/2019 |
| WO | 2019/107383 A1 | 6/2019 |

OTHER PUBLICATIONS

Namba et al., U.S. Appl. No. 17/012,265, filed Sep. 4, 2020.
Iimura et al., U.S. Appl. No. 17/012,279, filed Sep. 4, 2020.
Notification of Reasons for Refusal in Japanese Application No. 2019-165638 dated May 2023.

* cited by examiner

IMPRINT APPARATUS AND METHOD OF CONTROLLING IMPRINT APPARATUS

BACKGROUND OF THE INVENTION

Field of the Invention

The present invention relates to an imprint apparatus and a method of controlling the imprint apparatus.

Description of the Related Art

In an imprint apparatus, an ejection material such as a resist is ejected on a substrate by an inkjet type ejection device. Japanese Patent Laid-Open No. 2016-196128 (hereinafter, PTL 1) discloses a liquid ejection device used in the imprint apparatus. The liquid ejection device of PTL 1 includes a head and a housing, and the housing is partitioned into a first chamber and a second chamber by a flexible member. The first chamber stores the liquid to be ejected. The second chamber stores hydraulic liquid. A pressure control unit connected to the second chamber with a channel controls the pressure in the head. The channel is filled with the hydraulic liquid. PTL 1 describes a configuration for removing air bubbles in the channel.

In a case where bubbles are generated in the channel filled with the hydraulic liquid, the pressure control is not performed properly, and the ejection material leaks out of the head. If the ejection material leaks while the head is positioned above a substrate stage, the substrate stage is contaminated by the ejection material, and it takes considerable time to resume the operation of the apparatus.

SUMMARY OF THE INVENTION

An imprint apparatus according to an aspect of the present invention incudes: a movable housing unit; an ejection head provided in the housing unit and configured to eject an ejection material; a flexible member provided in the housing unit and separating the housing unit into a first storing space communicating with the ejection head and storing the ejection material and a second storing space storing hydraulic liquid; a channel communicating with the second storing space; and a pressure control unit configured to control a pressure in the second storing space through the channel. The imprint apparatus includes a detection unit configured to detect bubbles in the channel.

Further features of the present invention will become apparent from the following description of exemplary embodiments with reference to the attached drawings.

DESCRIPTION OF THE EMBODIMENTS

Figure 1:
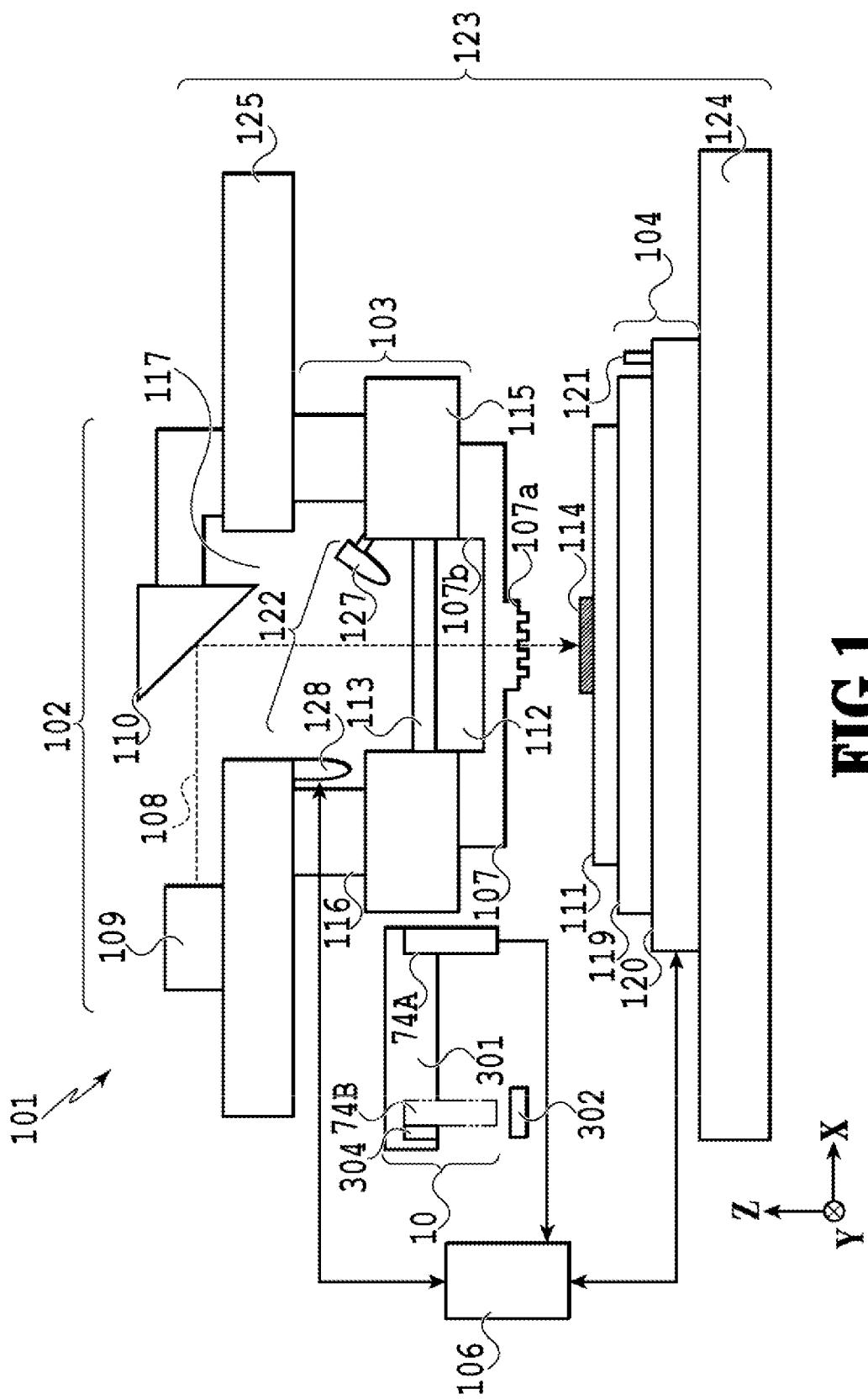
FIG. 1 is a schematic diagram of an imprint apparatus.

Hereinafter, embodiments are described with reference to the drawings. The same configurations are described with the same reference numerals assigned thereto. The relative arrangement, shapes, and the like of the constituents described in the embodiments are merely examples.

First Embodiment

<Imprint Apparatus>

FIG. 1 is a schematic diagram illustrating a configuration of an imprint apparatus 101 applicable to the present embodiment. The imprint apparatus 101 is used in manufacture of various devices including a semiconductor device. The imprint apparatus 101 includes an ejection device 10. The ejection device 10 ejects an ejection material 114 (resist) on a substrate 111. The ejection material 114 is a photocurable resin having properties of curing by receiving ultraviolet rays 108. The ejection material 114 is arbitrarily selected depending on various conditions such as the semiconductor device manufacture steps. For example, other than the photocurable one, a thermosetting resist may be used as the ejection material, and the imprint apparatus may be an apparatus that performs the imprint processing by curing the resist by heat. The ejection material 114 may be called an imprint material.

The imprint apparatus 101 performs the imprint processing including the following series of processing. Specifically, the imprint apparatus 101 causes the ejection device 10 to eject the ejection material 114 on the substrate 111. Then, a mold 107 including a pattern for molding is impressed on the ejection material 114 ejected on the substrate 111, and the ejection material 114 is cured by being irradiated with light (ultraviolet rays) with the mold 107 impressed. Thereafter, the mold 107 is pulled away from the cured ejection material 114, and thus the pattern of the mold 107 is transferred on the substrate 111.

The imprint apparatus 101 includes a light irradiation unit 102, a mold holding mechanism 103, a substrate stage 104, the ejection device 10, a control unit 106, a measuring unit 122, and a housing 123.

The light irradiation unit 102 includes a light source 109 and an optical element 110 that corrects the ultraviolet rays 108 radiated from the light source 109. The light source 109 is a halogen lamp that generates i-line or g-line, for example. The ultraviolet rays 108 are radiated to the ejection material 114 through the mold 107. The wavelength of the ultraviolet rays 108 is a wavelength depending on the ejection material 114 to be cured. In the case where the imprint apparatus uses the thermosetting resist as the resist, a heat source unit for curing the thermosetting resist is provided instead of the light irradiation unit 102.

The mold holding mechanism 103 includes a mold chuck 115 and a mold driving mechanism 116. The mold 107 held by the mold holding mechanism 103 has a rectangular circumference, and a surface facing the substrate 111 includes a pattern portion 107a in which a three-dimensional bumpy pattern such as a circuit pattern to be transferred is formed. The material of the mold 107 in the present embodiment is a material that allows the ultraviolet rays 108 to penetrate therethrough, and a quartz may be used, for example.

The mold chuck 115 holds the mold 107 by vacuum sucking or electrostatic force. The mold driving mechanism 116 moves while holding the mold chuck 115 to move the mold 107. The mold driving mechanism 116 can impress the mold 107 to the ejection material 114 by moving the mold 107 in the −Z direction. The mold driving mechanism 116 can pull away the mold 107 from the ejection material 114 by moving the mold 107 in the +Z direction. A linear motor or an air cylinder may be used as an actuator adoptable in the mold driving mechanism 116, for example.

The mold chuck 115 and the mold driving mechanism 116 each include an opening region 117 in the center. The mold 107 includes a concaved cavity 107b on a surface to be irradiated with the ultraviolet rays 108. The opening region 117 of the mold driving mechanism 116 is provided with a light transmissive member 113, and a closed space 112 surrounded by the light transmissive member 113, the cavity 107b, and the opening region 117 is formed. The pressure in the space 112 is controlled by a pressure correction device (not illustrated). The pressure correction device sets the pressure in the space 112 higher than the pressure outside to cause the pattern portion 107a to bend to be convex toward the substrate 111. Accordingly, the center of the pattern portion 107a comes in contact with the ejection material 114. Consequently, it is possible to inhibit gas (air) from being captured between the pattern portion 107a and the ejection material 114 while the mold 107 is impressed to the ejection material 114 and to fill the bumpy portions of the pattern portion 107a completely with the ejection material 114. The depth of the cavity 107b that determines the size of the space 112 is arbitrarily changed depending on the size or the material of the mold 107.

The substrate stage 104 includes a substrate chuck 119, a substrate stage housing 120, and a stage reference mark 121. The substrate 111 held by the substrate stage is a single crystal silicon substrate or a silicon on insulator (SOI) substrate, and the ejection material 114 is ejected on a processed surface of the substrate 111 to form the pattern.

The substrate chuck 119 holds the substrate 111 by vacuum sucking. The substrate stage housing 120 moves in the X direction and the Y direction while holding the substrate chuck 119 by a mechanical unit to move the substrate 111. The stage reference mark 121 is used to set a reference position of the substrate 111 during alignment of the substrate 111 and the mold 107.

A linear motor may be used as an actuator of the substrate stage housing 120, for example. Otherwise, the actuator of the substrate stage housing 120 may have a configuration including multiple driving systems such as a coarse motion driving system and a slight motion driving system.

The ejection device 10 ejects the uncured ejection material 114 in the liquid form from a nozzle and applies the ejection material 114 on the substrate 111. In the present embodiment, a method of pressing out the ejection material 114 from an ejection port by using the piezoelectric effect of a piezoelectric element is adopted. The later-described control unit 106 generates a driving waveform for driving the piezoelectric element and applies the driving waveform to the piezoelectric element to drive the piezoelectric element such that the piezoelectric element is deformed into a shape proper for the ejection. Multiple nozzles that are independently controllable are provided. The amount of the ejection material 114 ejected from the nozzles of the ejection device 10 is arbitrarily determined depending on the desired thickness of the ejection material 114 to be formed on the substrate 111 or the density of the pattern to be formed.

The measuring unit 122 includes an alignment measuring instrument 127 and an observation measuring instrument 128. The alignment measuring instrument 127 measures position displacement in the X direction and the Y direction between an alignment mark formed on the substrate 111 and an alignment mark formed on the mold 107. The observation measuring instrument 128 is an image capturing device such as a CCD camera, for example, and the observation measuring instrument 128 captures an image of the pattern of the ejection material 114 ejected on the substrate 111 and outputs the image to the control unit 106 as image information.

The control unit 106 controls operations of the constituents of the imprint apparatus 101. The control unit 106 includes a computer including a CPU, a ROM, and a RAM, for example. The control unit 106 is connected to the constituents of the imprint apparatus 101 through lines, and the CPU controls the constituents according to control programs stored in the ROM.

Based on the information measured by the measuring unit 122, the control unit 106 controls the operations of the mold holding mechanism 103, the substrate stage 104, and the ejection device 10. The control unit 106 may be formed integrally with another part of the imprint apparatus 101 or may be implemented as a different device separated from the imprint apparatus. The control unit 106 may be formed of multiple computers instead of a single computer.

The housing 123 includes a base surface plate 124 on which the substrate stage 104 is placed, a bridge surface plate 125 to which the mold holding mechanism 103 is fixed, and a post 126 extending from the base surface plate 124 to support the bridge surface plate 125.

The imprint apparatus 101 includes a mold transport mechanism (not illustrated) that transports the mold 107 from the outside of the apparatus to the mold holding mechanism 103 and a substrate transport mechanism (not illustrated) that transports the substrate 111 from the outside of the apparatus to the substrate stage 104.

<Ejection Device>

Figure 2:
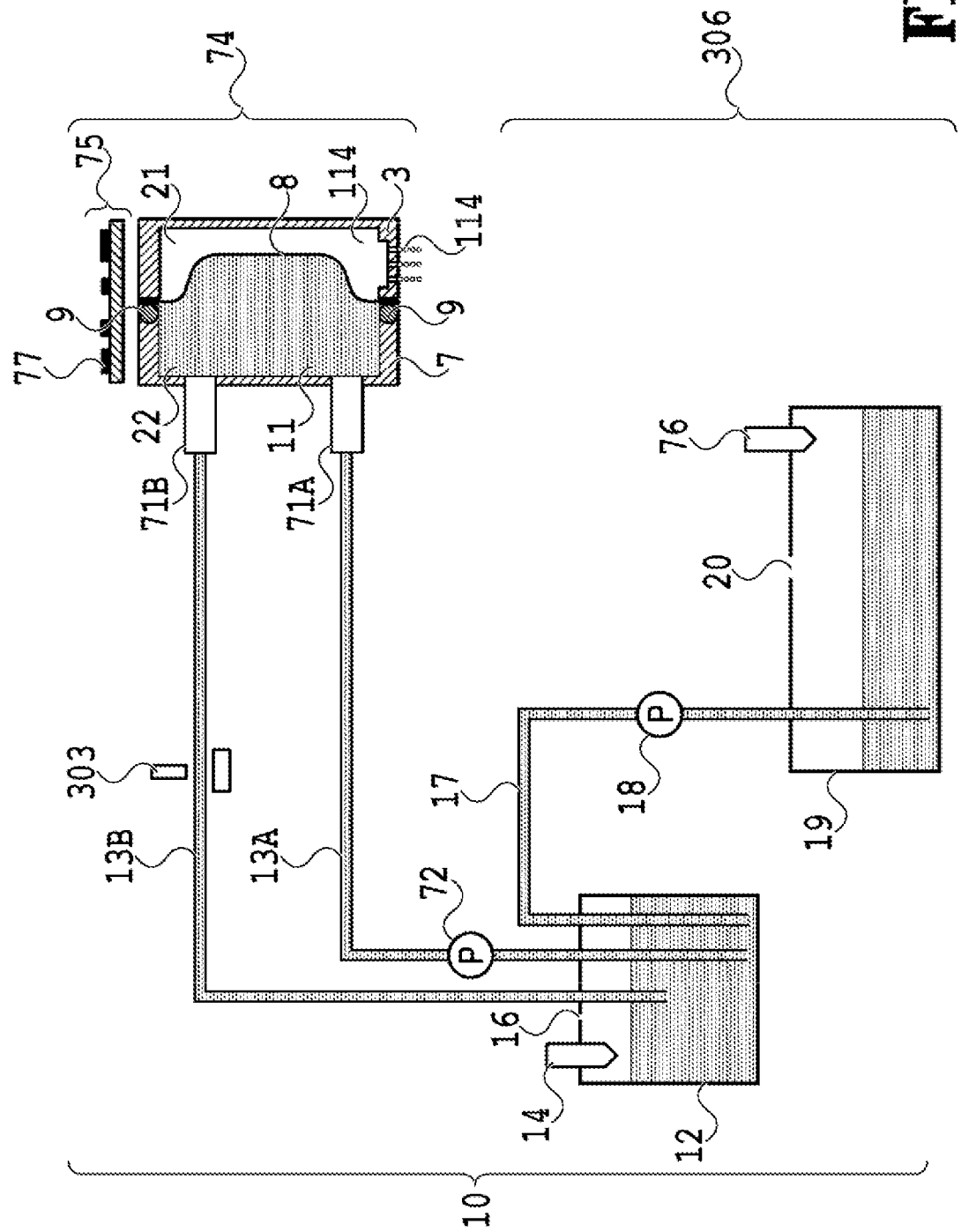
FIG. 2 is a schematic diagram of an ejection device.

FIG. 2 is a diagram illustrating overview of the ejection device 10. The details of the ejection device 10 are described with reference to FIGS. 1 and 2. First, overview of the ejection device 10 is described with reference to FIG. 2. The ejection device 10 includes a housing unit 74 and a pressure control unit 306. The pressure control unit 306 includes a sub tank 12 and a main tank 19. The housing unit 74 is attachable and detachable, and in a case where the ejection material 114 in the housing unit 74 is consumed, the housing unit 74 is detached at couplings 71A and 71B, and a new housing unit 74 filled with the ejection material 114 is attached and provided to the ejection device 10.

Next, the description of the ejection device 10 is continued with reference to FIG. 1. The housing unit 74 is held by an ejection device stage 301. The housing unit 74 is attached to the ejection device 10 at a standby position 74B. The housing unit 74 is fixed at the standby position 74B by a lock mechanism 304. A receiver 302 is arranged below the standby position 74B in the gravity direction, and the receiver 302 can collect the ejection material 114 even if the ejection material 114 leaks at the standby position 74B. The ejection device stage 301 is controlled by the control unit 106. The control unit 106 moves the housing unit 74 to an ejection position 74A for ejection.

Figure 3A:
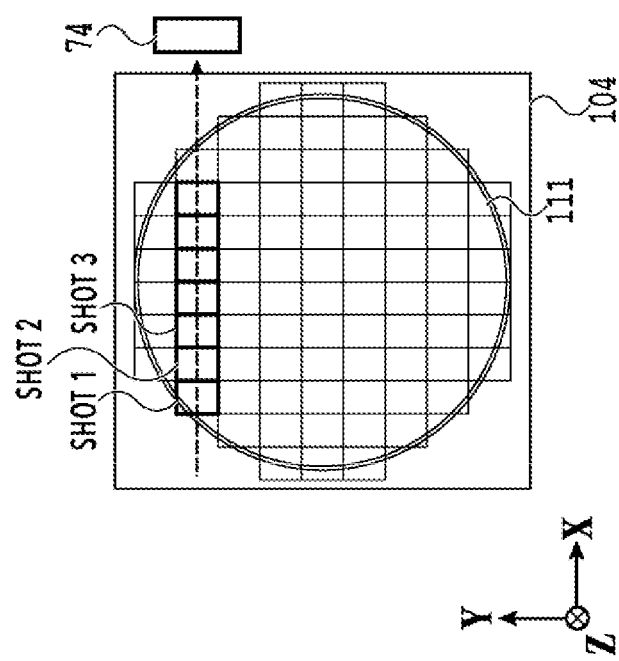
FIGS. 3A and 3B are diagrams describing movements of a housing unit in the imprint apparatus.
Figure 3B:
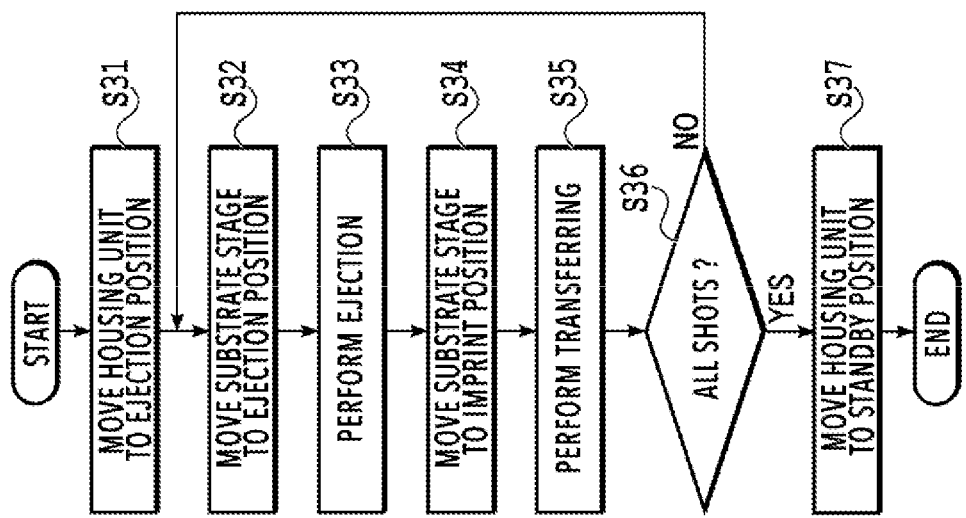

FIGS. 3A and 3B are diagrams describing movements of the housing unit 74 in the imprint apparatus 101. FIG. 3A is a plan view of the substrate 111, and rectangles on the substrate 111 each indicate a region used in each shot. The shot is an operation of transferring the pattern to each imprint region on the substrate 111. The example shows that the housing unit 74 performs the ejection operation while changing the shot in the X direction. FIG. 3B is a flowchart indicating an example of the imprint steps. The housing unit 74 is positioned at the standby position 74B (see FIG. 1) before the imprint steps. In S31, the control unit 106 moves the housing unit 74 to the ejection position 74A (see FIG. 1). In S32, the control unit 106 moves the substrate stage 104 including the substrate 111 to the ejection position as the processing target. In S33, the control unit 106 causes the housing unit 74 to perform the ejection operation. In S34, the control unit 106 moves the substrate stage 104 to the imprint position as the processing target. In S35, the control unit 106 performs the transferring operation. In S36, whether all the shots are completed is determined, and if all the shots are not completed, the process returns to S32 and repeats the processing. If all the shots are completed, in S37, the control unit 106 moves the housing unit 74 to the standby position 74B.

Next, referring back to FIG. 2, details of the ejection device 10 are described. The housing unit 74 includes a closed storing container 7, a flexible member 8 provided inside the storing container 7, an ejection head 3 that ejects the ejection material 114, and a control substrate 75 that controls the ejection head 3. The control substrate 75 is controlled by the control unit 106 of the imprint apparatus 101. The control substrate 75 includes a storage unit 77, and the remaining amount of the ejection material 114 is one of the stored pieces of information.

The pressure control unit 306 includes the sub tank 12, the main tank 19, a first channel 13A and a second channel 13B that allow the communication between the inside of the storing container 7 and the sub tank 12, and a third channel 17 that allows the communication between the sub tank 12 and the main tank 19. A pump 72 is arranged in the first channel 13A. A pump 18 is arranged in the third channel 17.

In the ejection head 3, 500 to 1000 pieces of ejection ports 31 and ejection mechanisms are arranged per inch. The ejection mechanisms are each formed of the piezoelectric element, for example, and the ejection material 114 is ejected from the ejection port 31 provided in the ejection head 3 by applying energy such as a pressure or a vibration to the ejection material 114. The ejection mechanism may have any configuration as long as the ejection mechanism can generate energy that allows the ejection material to be ejected in the form of a fine droplet such as a droplet of 1 pL, for example. The ejection head 3 does not include a control valve between the ejection head 3 and the storing container 7. For this reason, the internal pressure in the storing container 7 is controlled to be a little more negative pressure than the atmospheric pressure (outside atmospheric pressure) of the outside of the ejection port 31 of the ejection head 3. With this negative pressure control, the ejection material in the ejection port 31 forms a meniscus on an interface with the outside air, and leaking (dropping) of the ejection material from the ejection port at an unintentionally timing is prevented. In this example, the internal pressure in the storing container 7 is controlled to be a negative pressure than the outside atmospheric pressure by 0.40±0.04 kPa. The pressure in the storing container 7 is set to a negative pressure with respect to the atmospheric pressure to make the concavity of the meniscus deep and to prevent the meniscus from becoming unstable.

The inside of the storing container 7 is a closed space separated by the flexible member 8, and the ejection material 114 and hydraulic liquid 11 are filled in the two separated liquid chambers, respectively. To be more specific, the storing container 7 is separated into a first storing space 21 side and a second storing space 22 side by the flexible member 8. The first storing space 21 filled with the ejection material 114 is communicated with the ejection head 3. The second storing space 22 filled with the hydraulic liquid 11 is not communicated with the ejection head 3. The flexible member 8 is fastened while being sandwiched by a member on the first storing space 21 side and a member on the second storing space 22 side in the storing container 7 and is sealed by an O ring 9 to prevent leaking of the liquid inside.

The hydraulic liquid 11 is a substance having incompressibility in which the change in the density (volume) due to the external temperature and pressure is ignorably smaller than that of gas. Thus, even if the temperature or the pressure around the ejection device 10 is changed, the volume of the hydraulic liquid 11 is hardly changed. A substance selected from liquid like water or a gel substance may be used as the hydraulic liquid 11, for example.

The second storing space 22 is connected to the sub tank 12 through the first channel 13A and the second channel 13B formed of tubes and the like. The second storing space 22 and the sub tank 12 are communicated with each other through the second channel 13B and can also be communicated through the first channel 13A including the pump 72. The pump 72 is usually opened to transmit a pressure. The pump 72 is operated to circulate the hydraulic liquid 11 through the second channel 13B, the second storing space 22, and the first channel 13A. That is, the hydraulic liquid 11 filled in the second storing space 22 is collected into the sub tank 12, and the hydraulic liquid 11 filled in the sub tank 12 is supplied to the second storing space 22.

A sub tank air communication hole 16 is provided in the sub tank 12 and released into the atmosphere, and a liquid surface of the hydraulic liquid 11 in the sub tank 12 has the atmospheric pressure. Thus, a pressure due to the difference between the liquid surface of the hydraulic liquid 11 in the sub tank 12 and the height of the ejection head 3 in the vertical direction is applied to the ejection head 3. For example, if the liquid surface of the hydraulic liquid 11 in the sub tank 12 is made lower than the ejection head 3 by 4 cm, a pressure of −0.4 KPa is applied to the ejection head. Thus, such a configuration allows the control of the pressure applied to the ejection head 3 in the housing unit 74 by controlling the position of the liquid surface of the hydraulic liquid 11 in the sub tank 12.

As described above, the first storing space 21 and the second storing space 22 are separated by the flexible member 8. In this case, there is repeated an operation in which the flexible member 8 is moved to a side of lower internal pressure once a difference of internal pressures between the first storing space 21 and the second storing space 22 is generated, and the movement is stopped once the internal pressure difference is gone. With this, it is possible to maintain the internal pressures of the first storing space 21 and the second storing space 22 equal to each other. The space in which the hydraulic liquid 11 is stored is communicated with the inside of the sub tank 12, and the liquid surface in the sub tank 12 is set to a position lower than the ejection surface of the ejection head 3. With this, it is possible to inhibit the ejection material 114 from leaking out of the ejection head 3.

Once the ejection material 114 is ejected from the ejection head 3, the inner volume of the ejection material 114 in the first storing space 21 is decreased by the amount of the ejected ejection material, and the internal pressure in the first storing space 21 is decreased. In this process, the internal pressure in the second storing space 22 is relatively higher than the internal pressure in the first storing space 21. Accordingly, the flexible member 8 is moved toward the first storing space 21 filled with the ejection material 114. At the same time, the hydraulic liquid 11 is sucked into the second storing space 22 from the sub tank 12 through the first channel 13A. With this, the internal pressures of the first storing space 21 and the second storing space 22 of the storing container 7 are equalized again, and an equilibrated state is obtained.

Once the ejection device 10 performs the ejection operation, needless to say, the ejection material is consumed. In the case where the ejection material 114 in the housing unit 74 is consumed, the hydraulic liquid 11 is pumped out from the sub tank 12 and the liquid surface in the sub tank 12 is lowered by the consumed volume. Once the liquid surface of the sub tank 12 is lowered, the water head difference between the liquid surface of the sub tank 12 and the ejection head 3 is increased, the internal pressure in the storing container 7 becomes negative too much, and the outside air is sucked from the ejection port 31. In order to avoid this situation, the liquid surface in the sub tank 12 is detected by a sub tank liquid surface position detection sensor 14. If it is detected that the liquid surface is lower than a target value, the pump 18 performs a control of transferring the hydraulic liquid 11 to the sub tank 12 from the main tank 19 through the third channel 17. With this control, the liquid surface position of the sub tank 12 is controlled.

<Bubble Detection>

Next, bubble detection is described. The housing unit 74 is connected to the first channel 13A and the second channel 13B with the couplings 71A and 71B. In a case of connecting the couplings 71A and 71B to the housing unit 74 and the first and second channels 13A and 13B, if there is air in the couplings, bubbles enter the first channel 13A or the second channel 13B used for the pressure control. If the first channel 13A and the second channel 13B are resin tubes, not a few gas penetrates the resin tubes. Thus, bubbles may enter the first channel 13A or the second channel 13B.

In a case where there are bubbles in the first channel 13A or the second channel 13B, the hydraulic liquid 11 between the sub tank 12 and the second storing space 22 becomes not continuous, and the pressure cannot be controlled normally. Once the second storing space 22 has a positive pressure, the ejection material 114 leaks out of the ejection head 3 slowly.

In the present embodiment, a bubble detection unit 303 that detects the bubbles in the channels between the sub tank 12 and the second storing space 22 is arranged. In the example illustrated in FIG. 2, the bubble detection unit 303 is arranged on the second channel 13B; however, the bubble detection unit 303 may be arranged on the first channel 13A or may be arranged on both the first channel 13A and the second channel 13B.

In the detection of the bubbles, the pump 72 pumps the hydraulic liquid 11 from the sub tank 12 to the second storing space through the first channel 13A and circulates the hydraulic liquid 11 such that the pumped hydraulic liquid 11 returns to the sub tank 12 through the second channel 13B. With the hydraulic liquid 11 circulated in this way, the bubbles in the hydraulic liquid 11 can be removed by being transferred to the sub tank 12. Such a bubble removing circulation operation is performed for a predetermined period of time, and if no bubbles can be detected by the bubble detection unit 303 during this operation, it is possible to confirm that there are no bubbles in the first channel 13A and the second channel 13B.

Various types of devices may be used as the bubble detection unit 303. For example, the bubble detection unit 303 can use ultrasonic waves to detect the bubbles by detecting the ultrasonic waves reflected from the air bubbles. Otherwise, an optical detection sensor that uses light to detect the reflected light reflected from the air bubbles may be used as the bubble detection unit 303.

In a case where conductive liquid is used as the hydraulic liquid 11, it is possible to measure whether there are the bubbles between two points in the first channel 13A and the second channel 13B by measuring the electric resistances of the two points. That is, the bubble detection unit 303 may detect whether there are the bubbles by measuring the electric resistances. The advantage of this method is that the bubbles between two points can be measured. For example, an end on a sub tank 12 side of the second channel 13B is set outside the hydraulic liquid 11 in the sub tank 12. Then, one electrode is arranged in the sub tank 12, and the other electrode is arranged in the second channel 13B. With the electric resistances of the hydraulic liquid 11 measured in this state, it is possible to confirm that the sub tank 12, the first channel 13A, and the second storing space 22 are not discontinuous because of the bubbles.

It is also possible to measure whether there are the bubbles in a section of at least either of the first channel 13A and the second channel 13B by arranging a light source and a photo sensor in the section and using as a core material a liquid optical fiber in which liquid with excellent light transmissivity is sealed. For example, a light source of a wavelength insensitive to the ejection material 114 is arranged in the second storing space 22, and a photo sensor is arranged in the sub tank 12. The bubbles are detected by the light passing through the liquid optical fiber. With this, it is possible to confirm that the sub tank 12, the first channel 13A, the second channel 13B, and the second storing space 22 are not discontinuous because of the bubbles.

In this case, as described above, the housing unit 74 is able to move to the ejection position 74A and the standby position 74B. In the case where the housing unit 74 is positioned at the standby position 74B, it is possible to collect the ejection material 114 by the receiver 302 even if the ejection material 114 leaks due to the effect of the bubbles, as described with FIG. 1. However, if the housing unit 74 is moved to the ejection position 74A with the bubbles detected, the ejection material 114 may leak to the substrate stage housing 120 and the substrate chuck 119, and it takes considerable time to restore this leaking. Thus, the control unit 106 confirms that there are no bubbles before moving the housing unit 74 to the ejection position 74A.

Figure 4:
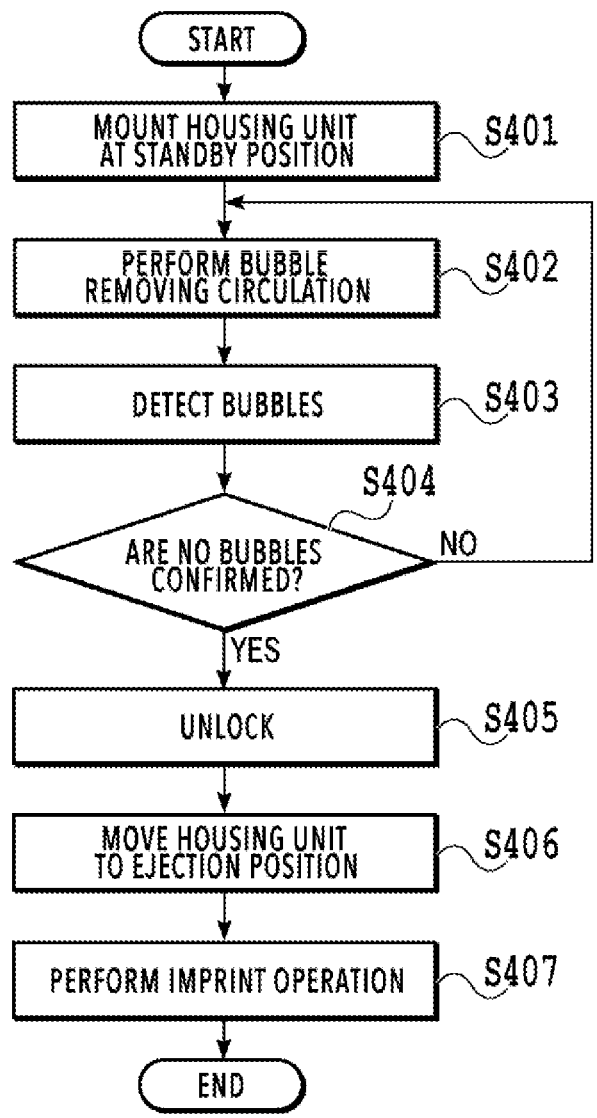
FIG. 4 is a flowchart indicating a control of positions of the housing unit.

FIG. 4 is a flowchart indicating a control of the positions of the housing unit 74 during and after the bubble detection. The flowchart of FIG. 4 is controlled by the control unit 106. In S401, the control unit 106 mounts the housing unit 74 at the standby position 74B. For example, the housing unit 74 from which the ejection material 114 is used up is replaced, and a new housing unit 74 is mounted. In S402, the control unit 106 executes the bubble removing circulation. As described above, the bubbles may enter the couplings 71 during mounting of the housing unit 74. Otherwise, the bubbles may enter the first channel 13A or the second channel 13B because of the air transmitted through the tube of the first channel 13A or the second channel 13B during transportation. The bubble removing circulation is performed by using the pump 72 to remove the bubbles. That is, the control unit 106 performs the bubble removing circulation at the standby position 74B.

In S403, the control unit 106 detects the bubbles by using the bubble detection unit 303 during the bubble removing circulation in S402 or after the bubble removing circulation. If it is confirmed that there are no bubbles in S404, the process proceeds to S405, and if it is detected that there are bubbles, the bubble removing circulation of S402 is performed again.

If no bubbles are detected in the bubble detection unit 303, it means that there are no bubbles in the first channel 13A and the second channel 13B. That is, since the pressure in the housing unit 74 can be controlled in normal way, it is inhibited that the inside of the housing unit 74 has a positive pressure because of the bubbles, and consequently, leaking of the ejection material 114 is inhibited. Thus, the control unit 106 in S405 unlocks the lock mechanism 304 fixing the housing unit 74 at the standby position 74B. In S406, the control unit 106 moves the housing unit 74 to the ejection position 74A. In S407, the control unit 106 performs the imprint operation.

With this control, it is possible to inhibit the housing unit 74 from being moved to the ejection position 74A with the bubbles contained in the first channel 13A or the second channel 13B. Thus, it is possible to inhibit the ejection material 114 from leaking to the substrate stage housing 120 or the substrate chuck 119.

The apparatus may be configured such that the lock mechanism 304 cannot be unlocked if the power is OFF, and the housing unit 74 cannot be moved to the ejection position 74A manually.

The control in the case of mounting the housing unit 74 in the ejection device 10 is described above. Next, an example of detecting whether there are the bubbles in the first channel 13A or the second channel 13B after mounting the housing unit 74 is described. In the case of performing the bubble removing circulation by the pump 72, the pulsing of the pump 72 may cause leaking of the ejection material 114 from the ejection head 3 in some cases. In this regard, it is not favorable to perform the bubble removing circulation at the position of the ejection position 74A. Thus, the control unit 106 moves the housing unit 74 to the standby position 74B at predetermined time intervals and starts the operation from the above-described S402. With this, it is possible to maintain the state in which there are no bubbles in the first channel 13A or the second channel 13B.

In the bubble detection with the above-described electric resistance or with the liquid optical fiber, it is possible to detect the bubbles in the first channel 13A or the second channel 13B without performing the bubble removing circulation. Thus, depending on the configuration of the bubble detection unit 303, it is possible to detect the bubbles constantly even in the state in which the housing unit 74 is positioned at the ejection position 74A. If the bubbles are detected in the first channel 13A or the second channel 13B at the ejection position 74A, the control unit 106 moves the housing unit 74 to the standby position 74B and starts the operation from the above-described S402.

As described above, in the present embodiment, it is possible to detect the possibility of leaking of the ejection material 114 in advance by providing the bubble detection unit 303. It is possible to inhibit the leaking of the ejection material 114 to the substrate stage housing 120 or the substrate chuck 119 by moving the housing unit 74 to the ejection position 74A after it is confirmed that there are no bubbles at the standby position 74B. A deaeration device may be provided in the first channel 13A or the second channel 13B. With this, it is possible to inhibit the generation of the bubbles in the first channel 13A or the second channel 13B.

Second Embodiment

In the first embodiment, the example of providing the bubble detection unit 303 as a detection unit in the first channel 13A or the second channel 13B to detect whether the bubbles are generated in the first channel 13A or the second channel 13B by the bubble detection unit 303 is described. In the present embodiment, an example of arranging a pressure sensor as a detection unit in the second storing space 22 of the housing unit 74 is described. That is, whether the bubbles are generated is detected by measuring a pressure by the pressure sensor.

Figure 5:
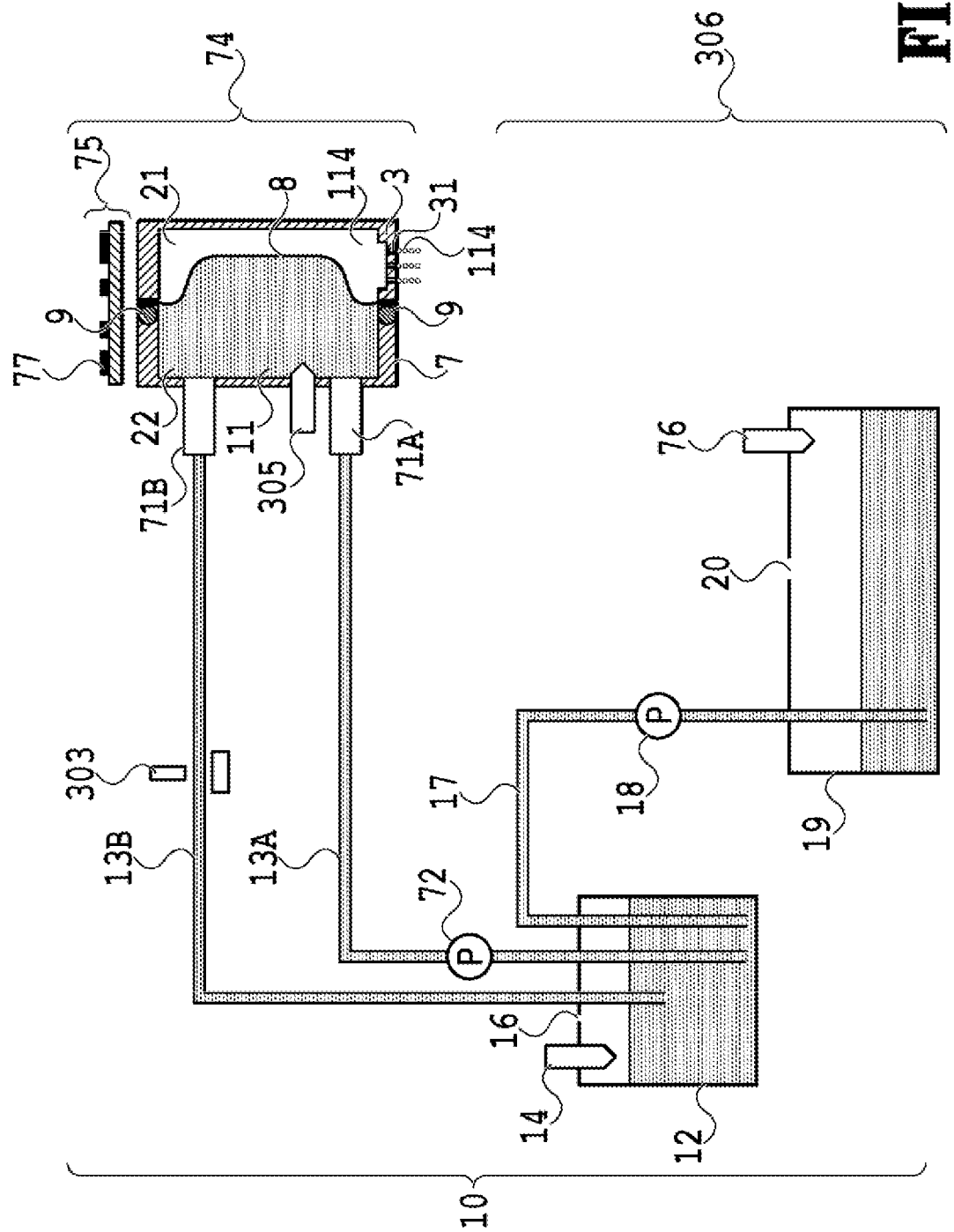
FIG. 5 is a schematic diagram of an ejection device.

FIG. 5 is a diagram illustrating an ejection device 10 of the present embodiment. A pressure sensor 305 is provided in the second storing space 22 of the housing unit 74, and the pressure sensor 305 measures the pressure in the second storing space 22. Other configurations are similar to that of the first embodiment, and descriptions thereof are omitted. FIG. 5 illustrates an example of including the bubble detection unit 303; however, the ejection device 10 may not include the bubble detection unit 303.

Figure 6:
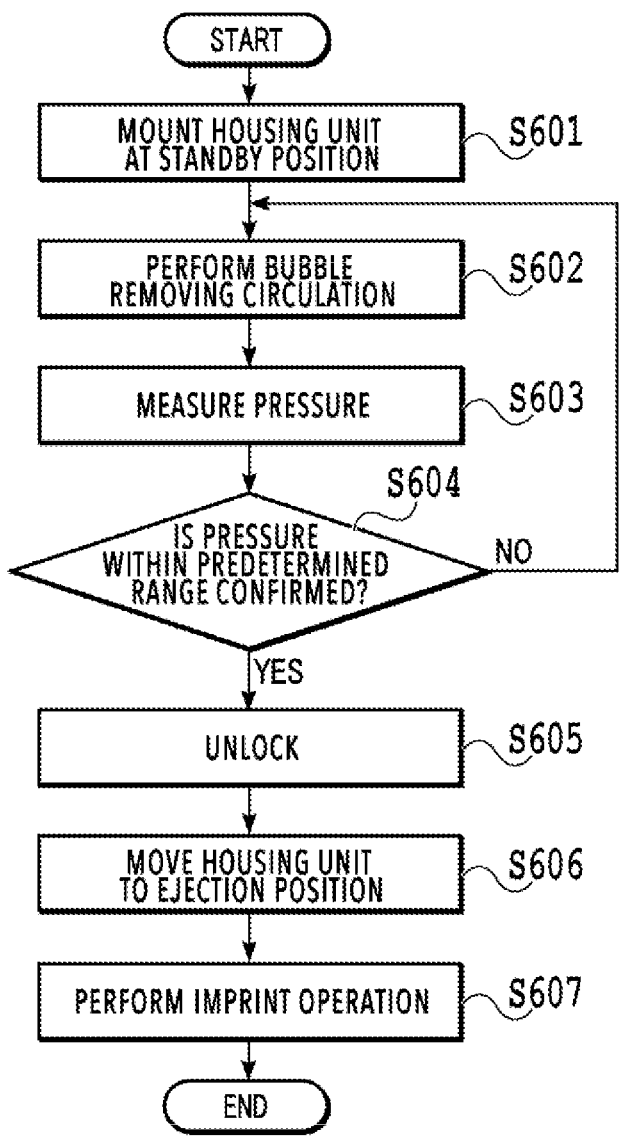
FIG. 6 is a flowchart indicating a control of positions of the housing unit.

FIG. 6 is a flowchart indicating a control of the positions of the housing unit 74 during and after the pressure measurement by the pressure sensor 305. The flowchart of FIG. 6 is executed by the control unit 106.

In S601, the control unit 106 mounts the housing unit 74 at the standby position 74B. For example, the housing unit 74 from which the ejection material 114 is used up is replaced, and a new housing unit 74 is mounted. In S602, the control unit 106 executes the bubble removing circulation. That is, the control unit 106 performs the bubble removing circulation at the standby position 74B.

After the bubble removing circulation, in S603, the control unit 106 measures the pressure in the second storing space 22 by using the pressure sensor 305. If the pressure is not within a predetermined range in S603, the control unit 106 determines that there are the bubbles, the process returns to S602, and the bubble removing circulation is performed again. On the other hand, if the pressure is within the predetermined range, the process proceeds to S605. If the pressure in the housing unit 74 is controlled normally, there are no bubbles in the channels, and the negative pressure is controlled properly. That is, the inside of the housing unit 74 does not have a positive pressure due to the bubbles, and leaking of the ejection material 114 is inhibited. Thus, in S605, the control unit 106 unlocks the lock mechanism 304 fixing the housing unit 74 at the standby position 74B. In S606, the control unit 106 moves the housing unit 74 to the ejection position 74A. Then, in S607, the control unit 106 performs the imprint operation.

With this control, it is possible to inhibit the movement of the housing unit 74 to the ejection position 74A while having a pressure abnormality. With this, it is possible to inhibit the ejection material 114 from leaking to the substrate stage housing 120 or the substrate chuck 119.

The control in the case of mounting the housing unit 74 in the ejection device 10 is described above. Next, an example of performing the pressure measurement after mounting the housing unit 74 is described. The pressure measurement by the pressure sensor 305 can be performed as needed even after the housing unit 74 is moved to the ejection position 74A. For example, the pressure measurement may be constantly performed by the pressure sensor 305. If the pressure sensor 305 detects that the pressure is out of a predetermined range while the housing unit 74 is positioned at the ejection position 74A, the control unit 106 moves the housing unit 74 to the standby position 74B. Then, the operation is started from the above-described S602.

As described above, in the present embodiment, it is possible to determine whether the pressure control is performed normally by providing the pressure sensor 305. That is, it is possible to determine whether the bubbles are generated in the channels depending on the pressure variation that may occur as a result of generation of the bubbles, and it is possible to detect the possibility of leaking of the ejection material 114 in advance.

If both the pressure sensor 305 and the bubble detection unit 303 are provided, the apparatus may be configured to unlock the lock mechanism 304 after it is confirmed that the bubble detection unit 303 detects no bubbles and the pressure detected by the pressure sensor is within a predetermined range.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-165638, filed Sep. 11, 2019, which is hereby incorporated by reference wherein in its entirety.

What is claimed is:

1. An imprint apparatus, including:
   a movable housing unit;
   an ejection head provided in the housing unit and configured to eject an ejection material;
   a flexible member provided in the housing unit and separating the housing unit into a first storing space communicating with the ejection head and storing the ejection material and a second storing space storing hydraulic liquid;
   a plurality of channels communicating with the second storing space, the plurality of channels including a first channel provided with a pump and a second channel;
   a pressure control unit configured to control a pressure in the second storing space through the plurality of channels; and
   a detection unit provided at the second storing space and configured to detect the pressure in the second storing space;
   wherein the apparatus is configured such that in a case where the pressure detected by the detection unit is not within a predetermined range, the pump circulates the hydraulic liquid through the plurality of channels, and in a case where the pressure detected by the detection unit is within the predetermined range, the housing unit is moved to an ejection position at which the ejection material is to be ejected.

2. The imprint apparatus according to claim 1, wherein the imprint apparatus is configured such that the detection unit detects the pressure in the second storing space after the hydraulic liquid is circulated by the pump.

3. The imprint apparatus according to claim 2, wherein the housing unit is replaceable, and wherein the imprint apparatus is configured such that the circulation of the hydraulic liquid by the pump and the detection by the detection unit are performed in a case where the housing unit is replaced.

4. The imprint apparatus according to claim 2, wherein the imprint apparatus is configured such that the housing unit returns to a standby position at predetermined time intervals, and the circulation of the hydraulic liquid by the pump and the detection by the detection unit are performed at the standby position.

5. The imprint apparatus according to claim 1, wherein the imprint apparatus is configured such that if the detection unit detects no bubbles by detecting the pressure in a case where the housing unit is positioned at a standby position, the housing unit is moved from the standby position to the ejection position.

6. The imprint apparatus according to claim 1, wherein the imprint apparatus is configured such that if the detection unit detects bubbles by detecting the pressure in a case where the housing unit is positioned at the ejection position, the housing unit is moved to a standby position.

7. The imprint apparatus according to claim 5, further comprising a lock mechanism configured to lock a movement of the housing unit from the standby position to the ejection position, and
   wherein the imprint apparatus is configured such that if the detection unit detects no bubbles by detecting the pressure in a state where the housing unit is locked by the lock mechanism at the standby position, the lock mechanism is unlocked.

8. The imprint apparatus according to claim 5, further comprising a receiver configured to receive the ejection material at a position facing the ejection head in a state where the housing unit is positioned at the standby position.

9. The imprint apparatus according to claim 1, wherein the hydraulic liquid is conductive liquid.

10. The imprint apparatus according to claim 1, wherein the detection unit comprises a pressure sensor.

11. The imprint apparatus according to claim 10,
    wherein the detection unit is configured to detect that bubbles are generated in the plurality of channels if the pressure in the second storing space measured by the pressure sensor is not within the predetermined range.

12. The imprint apparatus according to claim 1, further comprising a deaeration device provided to the plurality of channels.

13. The imprint apparatus according to claim 1, further comprising:
    a first stage configured to move the housing to a standby position and the ejection position; and
    a second stage configured to move, to the ejection position, a substrate on which the ejection material is ejected.

* * * * *